United States Patent [19]

Eisfeller

[11] Patent Number: 4,713,143
[45] Date of Patent: Dec. 15, 1987

[54] ETCHING OF VACUUM METALLIZED INDIUM

[75] Inventor: Richard C. Eisfeller, Greenland, N.H.

[73] Assignee: Davidson Textron Inc., Dover, N.H.

[21] Appl. No.: 39,064

[22] Filed: Apr. 16, 1987

[51] Int. Cl.[4] ............... B44C 1/22; C03C 15/00; C03C 25/06; C23F 1/02
[52] U.S. Cl. .................. 156/655; 156/656; 156/664; 156/668
[58] Field of Search ............ 428/31, 142, 215; 427/250, 307–309; 204/192.12, 192.14; 156/90, 654, 655, 659.1, 668, 656, 664; 252/79.5

[56] References Cited

U.S. PATENT DOCUMENTS

| 2,937,940 | 5/1960 | Weisberg et al. | 156/656 X |
| 2,992,125 | 7/1961 | Fustier | 117/7 |
| 2,993,806 | 7/1961 | Fisher et al. | 117/71 |
| 3,118,781 | 1/1964 | Downing | 117/33.3 |
| 3,620,804 | 11/1971 | Bauer et al. | 156/668 X |
| 3,914,472 | 10/1975 | Nakanishi et al. | 427/250 |
| 4,101,698 | 7/1978 | Dunning et al. | 428/31 |
| 4,131,530 | 12/1978 | Blum et al. | 204/192 C |
| 4,211,822 | 7/1980 | Kurfman et al. | 428/412 |
| 4,215,170 | 7/1980 | Oliva | 428/328 |
| 4,216,246 | 8/1980 | Iwasaki et al. | 156/668 X |
| 4,431,711 | 2/1984 | Eisfeller | 428/31 |
| 4,610,755 | 9/1986 | Beckett | 156/638 X |

Primary Examiner—William A. Powell
Attorney, Agent, or Firm—John C. Evans

[57] ABSTRACT

A plastic object is manufactured by a process including vacuum metallizing with a corrosion prone metal, namely indium, a dielectric substrate to form "islands" of the indium top coated with a clear resinous layer which encapsulates and insulates the islands, one from another. The indium islands are less than one thousand angstroms thick and have an average diameter of less than three thousand angstroms. The island structure is etched following the growth of the metal as it is deposited between the nucleation stage and the stage of channelization of formation of an electrically conductive film. The etchant is selected to clear channels between island structures to improve adhesion of a dielectric resinous top coat to the dielectric substrate by order of magnitude to adhesion to the islands.

A preferred application of this invention is the manufacture of exterior automobile trim components the base structure of which is a flexible elastomer such as a thermoplastic urethane.

16 Claims, 3 Drawing Figures

4,713,143

ETCHING OF VACUUM METALLIZED INDIUM

TECHNICAL FIELD

This invention pertains to bright trim articles and more particularly to a method for manufacturing bright trim articles by vapor deposition of amphoteric materials.

BACKGROUND ART

Vacuum metallizing of plastic and similar dielectric substrates is disclosed in various forms including U.S. Pat. Nos.
- 2,992,125; Fustier
- 2,993,806; Fisher
- 3,118,781; Downing
- 3,914,472; Nakanishi
- 4,101,698; Dunning
- 4,131,530; Blum
- 4,211,822; Kaufman
- 4,215,170; Oliva My prior U.S. Pat. No. 4,431,711 issued Feb. 14, 1984, relates to metal film island structure and spacing to the appearance and performance of a commercial product, to the conductivity of the metal layer, to the corrosion resistance of the metal layer and/or to the adhesion of the top coat. It further relates to nucleation and film growth to a desired island structure and spacing that achieves these ends.

With regard to the last statement, two excellent reference books are:
*Thin Film Phenomena*, Kasturi L. Chopra, Robert E. Kreiger Publishing Company, Huntington, N.Y., 1979. See especially pp. 163 et seq.
*Handbook of Thin Film Technology*, Leon I. Maissel and Reinhard Glang, McGraw-Hill Book Company, New York, N.Y., 1970. See especially pp. 8-32 et seq.

These texts discuss and illustrate the stages of metal film growth by vacuum deposition from metal nucleation and nuclei growth, to liquid coalescence, to electrically discrete islands, channelization with incipient film conductivity, and finally, full continuous film formation. Film formation of vacuum deposited metals on plastic substrates for commercial products, especially on elastomeric plastic substrates, is not discussed. Nor is the interdependence of the natures of the metal film and the top coating correlated with product performance.

My U.S. Pat. No. 4,431,711 shows the significant difference in performance to be obtained with a vacuum metallized flexible plastic product, top coated, where the metal particles are coalesced only to the island state instead of being allowed to coalesce to beyond the channelization stage where film conductivity is established.

In the '711 patent, the separate islands are coalesced from separate nucleation points and are globular or rounded and fused appearing and are part of the nucleation and growth process.

In general, the coalesced islands forming the indium films of the '711 patent are smaller and there is a much greater spacing between them that can be filled with the resin of the top coating, in effect encapsulating the islands and binding them to the substrate surface. The rounded islands are better protected by the resin and the film over all is far more corrosion resistant, surprisingly so. The metal film is much more securely adhered to the substrate—a very significant advantage. The appearance of the globular island product is better—it is more specular, more reflective.

The construction of the indium island structure in U.S. Pat. No. 4,431,711 includes islands that are separated by channels which receive the top coat to bond the resinous film of the top coat to the substrate for the indium island structures. While the island structures are suitable for their intended purpose, it has been observed that the channels formed between the individual islands also contain many clusters and smaller islands of residual material. It is believed that this material reduces the total effective area of substrate material to which the top coat can be bonded. Consequently, the resultant bright trim article may be subject to undesirable delamination between the top coat and the substrate material.

The prior art does not set forth a proven process for forming a clear channel configuration by use of etchants so as to improve adhesion of a top coat.

STATEMENT OF INVENTION AND ADVANTAGES

The present invention includes a process of manufacturing a corrosion resistant vacuum metallized article of bright metallic material in which a dielectric substrate surface has a vacuum deposited layer of metal selected from a group consisting of indium and alloys thereof which alloys are predominantly of indium and wherein the vacuum deposition is continued only until there is a formation of discrete islands which visually appear as a continuous film, but which have channels formed between the discrete islands of a dimension that will maintain the islands electrically non-conductive over the surface area of the substrate, wherein the process improvement includes etching the vacuum deposited discrete islands with a solvent which slowly dissolves residual amounts of indium from the channels between the distinct islands so as to clear the channels to expose additional bonding surfaces on the substrate for increasing the surface area of adhesion between the substrate and a protective dielectric top coat.

The deposited islands are formed by indium which is amphoteric and thus has some solubility in both acids and bases.

As deposited, the indium metal layer is composed of tiny islands ranging from tiny clusters of 25 angstroms or less in diameter. The tiny clusters are barely resolvable in the transmission electronic microscope. The islands can increase in diameter to sizes as large as 2,000 angstroms in diameter. Each of the islands is separate by channels which can be several hundred angstroms wide. However, in the deposition process to form the aforedescribed indium island structure, it is observed that many clusters and small islands of residual indium material may exist in the channels which produce the desired electrically non-conductive characteristics across the surface of the substrate.

In accordance with the present invention, the process includes etching the previously deposited indium material with a solution that slowly dissolves the small clusters and islands to clean the channels and thereby define an additional surface area against which the top coat can adhere to the base coat so as to improve its adhesion to the base coat.

The typical adhesion strength of a top coat material to a base coat material is in the order of 2 orders of magnitude stronger than the adhesion strength of the top coat to the metal making up the individual island structures separated by the channels.

The treatment steps for vacuum deposited islands just before top coating consists of rinsing the part in a 10% NaOH solution for 60 to 90 seconds in a temperature range of 150°–160° F. followed by two water rinses and a second rinse with deionized water. This etch treatment step greatly improves the adhesion of top coat material of the type set forth in U.S. Pat. No. 4,431,711. While the flexible substrate described in U.S. Pat. No. 4,431,711 has sufficient adhesion to pass most automotive specification tests, it is desirable to improve the adhesion in such article so that it will consistently pass an X-scribed type taped adhesion test after either Florida exposures or accelerated weathering tests including (QUV, weatherometer, xenon, dual carbon arc weatherometer). With increasing emphasis on quality in American made cars, such tests are now beginning to show up in automotive specifications (see, for example, Fisher Body FBMS 1-51 specification). While etching the island containing metal layers of the type described in U.S. Pat. No., 4,431,711, an improved adhesion between top coat and base coat materials results so that such X-scribed standards can be met.

PRESENT INVENTION

The present invention includes use of such an etchant step to improve an article of manufacture comprising an organic dielectric base or substrate having a smooth surface such as a molded plastic, a macroscopically continuous-appearing very thin layer thereon of a vacuum deposited corrosion prone metal, specifically indium and alloys thereof consisting predominantly of indium and acting in much the same manner as pure indium. Preferably, the alloys each have a melting point in the range of 125° to 250° C. The resultant metal is in the form of minute specular electrically discrete rounded metal islands with channels formed therebetween. The part is etched subsequent to island formation and prior to application of a protective top coat, so as to clear residual deposits of metal from the channels thereby to define a high adhesion force bonding surface between the top coat and the article of manufacture. Then a top coating is applied over the metal film encapsulating and protecting the metal particles and binding them firmly to the substrate.

This resultant product is particularly useful in the automotive applications as an automobile exterior trim component to replace heavier and more expensive conventional chrome plated metal parts.

The present process retains the thin vacuum metallized layer as an indium layer deposited or coalesced into electrically discrete islands which are maintained electrically non-conductive. However, it improves over the prior art by improving adhesion of the topcoat to protect the indium against corrosion even though it is a metal that is especially corrosion prone.

The invention will now be described by way of the following examples and with reference to the accompanying drawing, with it being understood that other advantages and a more complete understanding of the invention will be apparent to those skilled in the art from the succeeding detailed description of the invention and the accompanying drawing hereto.

Figure 1:
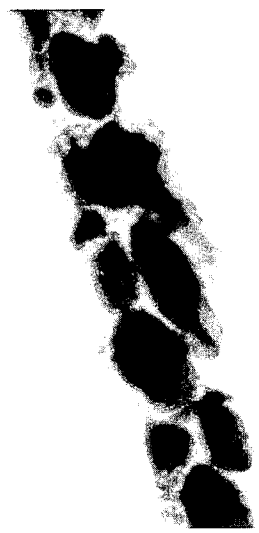
FIG. 1 is a microphotograph at 100,000 magnification take by transmission electron microscopy (TEM). The resolution by TEM is provided to show the island spacing or channel width and to show the residual indium formation therein prior to the etching step of the present invention.
Figure 2:
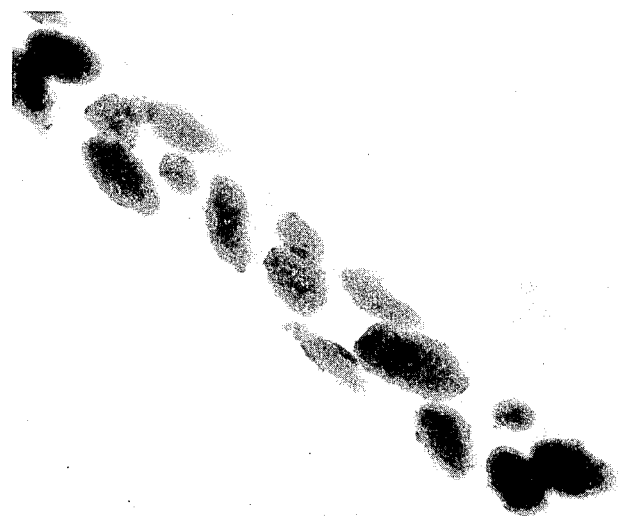
FIG. 2 is a view of the island structure of the indium film subsequent to the etchant step at a magnification of 100,000 taken by TEM.

In both FIGS. 1 and 2, vacuum deposited indium film was microtomed to give slices that were 20 to 50 microns thick. These slices were encapsulated in an epoxy and were then microtomed or shaved to a tiny tip which contained the sample. The tip was then microtomed into approximately 1,000° A thick specimens which were floated onto tiny copper grids. A diamond microtome was used in the specimen preparation.

Photographs were taken of the indium layer at the 100,000 magnification.

As can be seen from FIG. 1, prior to etching the primary indium islands are widely separated. However, the channels include the presence of clusters and small islands of indium material that effectively prevent the full surface are of the bottom of the separating channels between the larger island structures to be bonded to a top coat material.

As seen in FIG. 2, following the etching step to be described, the indium islands are still separated by channels of a wide spacing as set forth in FIG. 1. However, the cleaning out of the channels by removing the residual clusters and small islands from the channel is clearly shown.

Measurements of the surface energy of the metal layer both prior and following the etching step shows that there is no significant change in the surface energy of the metal layer due to etching.

The etched islands as shown in FIG. 2 are slightly smaller than the unetched islands, and it is apparent that there are a greater number of middle sized island structures.

Such increase in polydispersity can result in a lower reflectance and an increased haze level after etching. Accordingly, it is important to control the degree of etch to optimize both adhesion and resultant appearance of the bright trim article.

From experiments with different acids and bases, it has been found that several acids or bases can etch the previously deposited indium metal island structures to produce the desired results.

Table 2 shows the result of etching with a number of acids and bases with a flexible bright trimmed island deposition of indium material over TPU (thermoplastic polyurethane).

All acids and bases evaluated as etchants were found to improve adhesion. All gave better adhesion and lower reflectance with increasing etch concentration, etch time and etch temperature. The concentrations, etch times and temperatures and pH to give an optimum etch with each acid or base varied widely.

Figure 3:
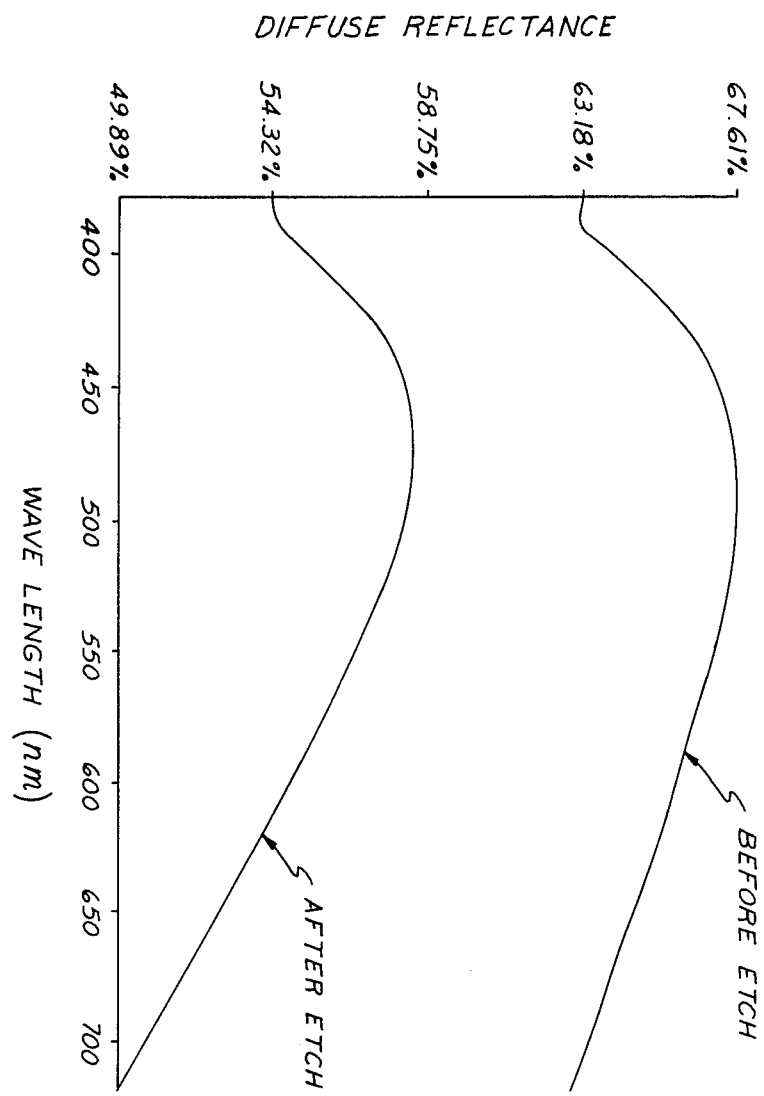
FIG. 3 is a chart showing the reflectance of a part before and after the etchant process of the invention.

The optimum reflectance to give acceptable adhesion results (very little or no loss in a customer specified X-scribed adhesion test range) is in the mid to upper 50s regardless of the type of etchant used. Such reflectance is measured by a diffuse illumination of the part surface by an 18 inch diameter sphere by a standard broad band light source according to a manufacturer's instructions. A barium sulfide surface has a diffuse reflectance of 100% on such a scale. FIG. 3 is an example of the invention's reflectance from a 220° A thick coating of indium with a clear top coat after the etchant step. It can be seen that the diffuse reflectance of the indium coating accomplishes the objective of a diffuse reflectance in the range of 50 throughout the wave length band of energy imposed thereon.

Of all of the examples of etchants used, the preferred etchant is a 10% sodium hydroxide solution. The preferred etch conditions are a 60-90 second etch period at a temperature of 150°-160° F. Such a solution and etch period and temperature produces consistently good performance. The higher solution concentration and greater length of etch time results in better control over the etching conditions. Most of the etch studies set forth herein have been done by dipping the metallized plaques or parts into the etch solution. Preliminary experiments indicate that spraying the etchant onto the parts will also perform suitably in the process.

At least two rinses are necessary after the etching period. The water from the final rinse should be deionized water that is rapidly blown off the part with high velocity air to prevent streaking on the metal layer defined by the indium island structures.

The improved weathering results of a bright trim indium island structure system over a TPU base with and without etching is shown in the following Table I.

TABLE I
WEATHERING RESULTS WITH DAVIDSON CC-2042
BRIGHT TRIM SYSTEM OVER TPU
% LOSS AFTER X-SCRIBE ADHESION TEST
WITH 3M - 610 TAPE

| Sample | Etch | 1000 Hours Weatherometer | 1000 Hours Xenon |
|---|---|---|---|
| 776-152G | Yes | 0 | 0 |
| 776-48C | No | 25 | — |

| Sample | 1000 Hours QUV | 1000 Hours Dual Carbon Arc Weatherometer | 12 Months Florida |
|---|---|---|---|
| 776-152G | 0 | 0 | 0 |
| 776-48C | 25 | — | 25 |

Adhesion results with different acids and bases are set forth in the following Table II.

TABLE II
ADHESION RESULTS WITH DIFFERENT ACIDS AND BASES

| Sample | Reflectance | Acid or Base | Temp. of Acid or Base | Treatment Time (Sec.) |
|---|---|---|---|---|
| 834-29I | 65 | None | — | — |
| 834-26B | 60 | 5% NaOH | 150° F. | 80 |
| 834-26C | 59 | 10% NaOH | 150° F. | 40 |
| 834-26D | 59 | 10% NaOH | 150° F. | 80 |
| 834-26F | 56 | 15% NaOH | 150° F. | 80 |
| 834-27B | 64 | 10% KOH | 150° F. | 80 |
| 834-25B | 57 | 0.01 N Hcl | Ambient | 40 |
| 834-25F | 54 | 0.01 N Hcl | Ambient | 40 |
| 834-27F | 54 | 1.0 N Phosphoric | 130° F. | 80 |
| 834-28D | 51 | 0.1 N Nitric | Ambient | 40 |
| 834-29A | 51 | 0.1 N Sulfuric | Ambient | 40 |
| 834-29F | 49 | 0.1 N Acetic | 130° F. | 160 |

| Sample | pH of Acid or Base | Hydrolytic Tests Multiple Tape Crosshatch Test (% Loss) | 1000 Hours Accelerated Weathering Tests X-Scribe (% Loss) | Multiple Tape Crosshatch (% Loss) |
|---|---|---|---|---|
| 834-29I | — | 90 | 35 | 100 |
| 834-26B | 13.0 | 0 | 20 | 100 |
| 834-26C | 13.3 | 0 | 12 | 97 |
| 834-26D | 13.3 | 0 | 0 | 83 |
| 834-26F | 13.5 | 0 | 6 | 73 |
| 834-27B | 13.9 | 0 | 23 | 100 |
| 834-25B | 2.1 | 0 | 3 | 79 |
| 834-25F | 0.55 | 0 | 1 | 60 |
| 834-27F | 2.2 | 0 | 0 | 54 |
| 834-28D | 2.0 | 0 | 14 | 99 |
| 834-29A | 1.3 | 0 | 0 | 68 |
| 834-29F | 3.6 | 0 | 3 | 50 |

Table II shows that the adhesion test for a nonetched material will produce substantial percentage losses under hydrolytic tests of a moldable tape cross hatch test, while there is no loss under such a test where an etchant has been used to clear the channels for better bonding of the top coat to the base material.

The X-scribed percent loss following etching is less than with no etching for all the etchant solutions. The etching step also improves a multiple tape cross hatch percentage of loss in all cases except for the use of potassium hydroxide in a 10% solution range.

Representative embodiments of different etchant processes have been shown and discussed, those skilled in the art will recognize that various changes and modifications may be made within the scope and equivalency range of the present invention.

What is claimed is:

1. In a process of manufacturing a corrosion resistant vacuum metallized article in which a dielectric substrate surface has vacuum deposition thereon of a corrosive metal and wherein vacuum deposition of the metal continues only until there is formation of discrete islands of said metal which visually appear as a continuous film while having channels between discrete islands to maintain electrically non-conductive the film over the substrate, the improvement comprising: etching the vacuum deposited material with a solvent which dissolves residuals of metal from the channels to clear the channels so as to expose clean bonding surfaces on the substrate at the base of the channels and applying a clear resinous protective dielectric top coat to both the surfaces of the discrete islands and to the clean bonding surfaces and drying the top coat to form a protective film encapsulating said discrete islands and bonded to the substrate at the base of the channels by a bond force throughout the surface extent of the channel base greater than two orders of magnitude in strength as compared to the bond force between the top coat and the discrete islands.

2. In the process of claim 1, etching with a solvent having a pH in the range of 0.50 to 13.0.

3. In the process of claim 1, etching with a solvent of sodium hydroxide solution having a concentration of NaOH in the range of 5% to 15%.

4. In the process of claim 1, the vacuum deposition of formation of the discrete islands continuing until the islands have an average diameter of less than 3500° A, the visually continuous film transmits less that 25% of the visible light incident thereon at an angle greater than 60%; applying the etchant at a concentration, etch time and etch temperature to reduce the diameter of said islands to produce an increase in dispersity between such islands while maintaining the reflectance from the islands between 50 and 60 compared to a pre-etch reflectance in the order of 65 throughout a preselected range of light wave lengths.

5. In the combination of claim 4, etching the islands with a 10% sodium hydroxide solution for an etch time of 60–90 seconds at an etch temperature of 150°–160° F.

6. In the combination of claim 1, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

7. In the combination of claim 4, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

8. In the combination of claim 5, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

9. In a process of manufacturing a corrosion resistant vacuum metallized article in which: a dielectric substrate surface has vacuum deposition thereon of a metal selected from the group consisting of indium and alloys thereof consisting predominantly of indium and wherein the vacuum deposition continues only until there is formation of discrete islands of said metal which visually appear as a continuous film while having channels between discrete islands to maintain electrically non-conductive the film over the substrate, the improvement comprising: etching the vacuum deposited material with a solvent which dissolves residuals of indium from the channels to clear the channels so as to expose clean bonding surfaces on the substrate at the base of the channels and applying a clear resinous protective dielectric top coat to both the surfaces of the discrete islands and to the clean bonding surfaces and drying the top coat to form a protective film encapsulating said discrete islands and bonded to the substrate at the base of the channels by a bond force throughout the surface extent of the channel base greater than two orders of magnitude in strength as compared to the bond force between the top coat and the discrete islands.

10. In the process of claim 9, etching with a solvent having a pH in the range of 0.50 to 13.0.

11. In the process of claim 9, etching with a solvent of sodium hydroxide solution having a concentration of NaOH in the range of 5% to 15%.

12. In the process of claim 9, the vacuum deposition of formation of the discrete islands continuing until the islands have an average diameter of less than 3500° A, the visually continuous film transmits less that 25% of the visible light incident thereon at an angle greater than 60%; applying the etchant at a concentration, etch time and etch temperature to reduce the diameter of said islands to produce an increase in dispersity between such islands while maintaining the reflectance from the islands between 50 and 60 compared to a pre-etch reflectance in the order of 65 throughout a preselected range of light wave lengths.

13. In the combination of claim 9, etching the islands with a 10% sodium hydroxide solution for an etch time of 60–90 seconds at an etch temperature of 150°–160° F.

14. In the combination of claim 9, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

15. In the combination of claim 9, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

16. In the combination of claim 9, rinsing the etch material from the part prior to application of the top coat through at least two rinses, applying the last rinse as deionized water and thereafter rapidly blowing all of the last rinse material from the part to prevent the occurrence of rinse streaks on the metal film prior to application of the top coat thereon.

* * * * *